United States Patent [19]

Duke

[11] Patent Number: 5,049,902
[45] Date of Patent: Sep. 17, 1991

[54] SYSTEM FOR RECORDING AN IMAGE

[75] Inventor: Ronald J. Duke, Miamisburg, Ohio

[73] Assignee: The Mead Corporation, Dayton, Ohio

[21] Appl. No.: 422,923

[22] Filed: Oct. 17, 1989

[51] Int. Cl.[5] ............................................. G01D 9/42
[52] U.S. Cl. ................................ 346/110 R; 346/108; 358/75; 358/78
[58] Field of Search ............. 346/110 R, 108; 358/75, 358/78

[56] References Cited

U.S. PATENT DOCUMENTS

| | | | |
|---|---|---|---|
| 4,309,720 | 1/1982 | Denham | 346/110 R |
| 4,399,209 | 8/1983 | Sanders et al. | 430/138 |
| 4,440,846 | 3/1984 | Sanders et al. | 430/138 |
| 4,576,891 | 3/1986 | Adair et al. | 430/138 |
| 4,796,036 | 1/1989 | Misono et al. | 346/108 |
| 4,804,611 | 2/1989 | Geis | 430/1.38 |
| 4,842,976 | 6/1989 | Sanders et al. | 430/138 |
| 4,923,779 | 5/1990 | Nelson | 355/27 |
| 4,943,827 | 7/1990 | Good et al. | 355/30 |

Primary Examiner—Benjamin R. Fuller
Assistant Examiner—Huan Tran
Attorney, Agent, or Firm—Thomas A. Boshinski

[57] ABSTRACT

A system for recording an image utilizes a microencapsulated media wherein the microcapsules contain an image forming agent and a photohardenable composition. A cathode ray tube has a faceplate formed from an array of parallel optical fibers and a phosphor coating applied on an inside surface of the faceplate. The cathode ray tube is controlled to write the image onto the coating so as to scroll the image over the coating. The imaging sheet is supported and moved past the faceplate at a rate equal to the scroll rate, whereby an entire image is exposed onto the sheet. Adapting such a system to full-color images is also disclosed.

3 Claims, 7 Drawing Sheets

SYSTEM FOR RECORDING AN IMAGE

BACKGROUND OF THE INVENTION

The present invention relates generally to an imaging system utilizing imaging sheets having a surface coating of rupturable photosensitive microcapsules and, more particularly, to a method and apparatus for exposing the imaging sheets with image information.

U.S. Pat. Nos. 4,440,846 and 4,399,209 describe an imaging system wherein a photosensitive layer comprising microcapsules containing a photosensitive composition in the internal phase is imagewise exposed to actinic radiation and subjected to a uniform rupturing force whereupon the microcapsules rupture and imagewise release the internal phase. The imaging system is particularly advantageous because it is a totally dry system and does not rely upon the application of wet developing processing solutions to produce the image. An image-forming chromogenic material, such as a substantially colorless color former, is typically associated with the microcapsules. When the microcapsules rupture, the color former imagewise reacts with a developer material and produces a color image. In the embodiments described in the referenced patents, the microcapsules are typically ruptured by passing imagewise exposed imaging sheets through the nip formed between a pair of parallel calendar rolls.

The media may exist in either single-sheet or two-sheet versions. In the former case, the microcapsules and developer composition are both coated onto a single substrate layer. In the latter case, the microcapsules are carried on a first substrate layer referred to as a donor sheet. The developer composition is coated onto a second, separate substrate layer referred to as a receiver sheet. The donor sheet is subjected to the actinic radiation, and the exposed microcapsule layer is then brought into contact with the developer layer of the receiver sheet. The two sheets are then developed by pressure, with the finished image being formed in the receiver sheet.

The disclosed imaging system may be designed to produce color images. In such case, three or more different types of capsules may be present on the sheet. Each is responsive to a different wavelength of exposure radiation and contains color formers designed to produce different colors upon subsequent development. Disclosure of such systems is made in U.S. Pat. No. 4,576,891 and U.S. Pat. No. 482,976.

Exposure of a color media can be made complicated due to differing sensitivities of the microcapsules corresponding to the different color. Thus, without some means of compensation, the color balance in the produced image may differ considerably from the original image.

U.S. patent application Ser. No. 262,545 filed Oct. 25, 1988, discusses a phenomenon exhibited by the imaging media known as short time scale reciprocity failure. Absent this effect, it would be expected that the imaging media would exhibit a substantially linear relationship between exposure time and exposure intensity. However, at short exposure times, the media exhibits a dramatic loss in sensitivity. This effect is also complicated in a color system, since the microcapsules for the different colors may exhibit reciprocity failure beginning at different threshold intensities, and may exhibit such effect to differing degrees.

What is needed, therefore, is a system for exposing the microencapsulated media with image information, and particularly for exposing a color microencapsulated media to color image information. Such exposure system should be capable of manipulating the color balance of the image information in accordance with the requirements of the media, and should be capable of minimizing the effects of short time-scale reciprocity failure.

SUMMARY OF THE INVENTION

The present invention provides a system for recording an image. A sheet of photosensitive media includes a supportive substrate with a layer of microcapsules coated thereon. The microcapsules contain an image-forming agent and a photohardenable composition.

A cathode ray tube is provided with a faceplate. A phosphor coating is applied on an inside surface of the faceplate. The faceplate itself comprises an array of parallel optical fibers.

Means is provided for generating an image signal corresponding to an image to be recorded. A control means receives the image signal and controls the cathode ray tube to write the image onto the phosphor coating so as to scroll the image at a first scroll rate over the phosphor coating. The sheet is supported and moved past the faceplate with the microcapsules adjacent the faceplate, at a rate equal to the first scroll rate whereby an entire image is exposed onto the sheet.

For recording a color image, the sheet of photosensitive material includes a supportive substrate coated with a layer of intermixed first and second microcapsules. The first microcapsules contain a first color image forming agent and a first photohardenable composition responsive to a light of a first wavelength. The second microcapsules contain a second color image forming agent and a second photohardenable composition responsive to light of a second wavelength.

The cathode ray tube includes a faceplate having first and second color phosphor coatings applied on an inside surface of the faceplate. The first and second coatings are applied to define first and second stripes, respectively, each extending across the faceplate and having first and second widths, respectively. The faceplate comprise an array of parallel optical fibers.

First and second image signals are generated corresponding to first and second color components, respectively, of a color image to be recorded. Control means receives the first and second image signals and controls the cathode ray tube to write the first color component onto the first the phosphor coating, and to write the second color component onto the second phosphor coating in such a way as to scroll the first and second color components at a first scroll rate over the phosphor coatings. The sheet is supported and moved past the faceplate with the microcapsules adjacent thereto, at a rate equal to the first scroll rate whereby an entire image comprised of the first and second color components is exposed onto the sheet.

The first width of the first strip may be greater than the second width of the second stripe, with the widths also being less than the length of the entire image. In such a case, the cathode ray tube is controlled to write the first color component onto the first phosphor coating at an intensity which is less than that at which the second color component is written onto the second phosphor coating.

In an alternate embodiment, the first and second phosphor coatings may be at least partially coincident.

Accordingly, it is an object of the present invention to provide a system for producing images on a color imaging sheet of the type described above; to provide such a system where relative adjustments in the color balance of the color image can be easily made; and to provide such a system wherein compensation for short time scale reciprocity failure of the imaging media may be made.

Other objects and advantages of the present invention will be apparent from the following description, the accompanying drawings and the appended claims.

DETAILED DESCRIPTION OF THE PREFERRED EMBODIMENTS

Figure 1A:
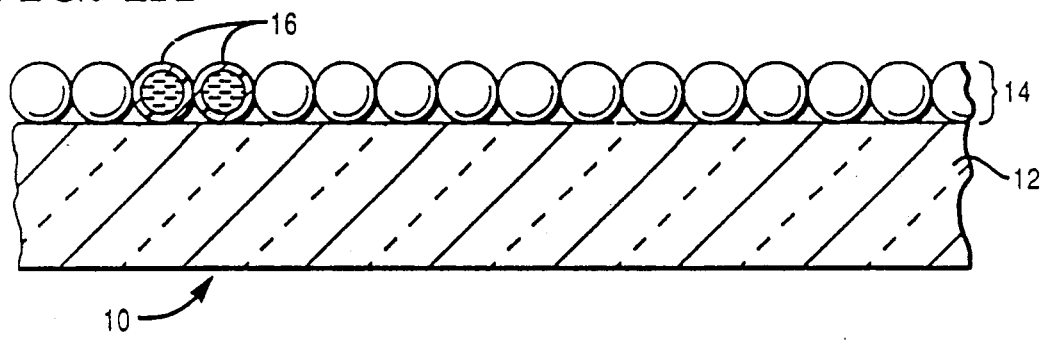
FIGS. 1A–1C show an example of an imaging media which is used with the present invention.

While describing the preferred embodiments, specific terminology will be utilized for the sake of clarity. It is to be understood that such terminology includes not only the recited embodiments, but all technical equivalents which perform substantially the same function in substantially the same way to obtain the same result.

The present invention utilizes imaging sheets in accordance with those described in U.S. Pat. Nos. 4,399,209 and 4,440,846, both of which are incorporated by reference. The imaging sheet has coated on one of its surfaces a layer of microcapsules. The microcapsules contain a photohardenable composition including a radiation curable composition and a photoinitiator. Photohardenable compositions such as photopolymerizable and photocross-linkable materials increase in viscosity or solidify upon exposure to radiation. The photoinitiators selected are typically those which are photosensitive and able to generate free radicals to initiate polymerization of the photopolymerizable or crosslinkable material. In association with the microcapsules is an image-forming agent.

Various radiation sensitive materials, photoinitiators and image-forming agents can be used in conjunction with the photosensitive materials of the present invention.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup is ethylenically unsaturated acid esters of polyhydric alcohols, such as trimethylol propane triacrylate (TMPTA) and dipentaerythritol hydroxypentaacrylate (DPHPA).

A preferred photoinitiator system for use in the present invention includes ionic dye-counter ion compounds described in European Application Publication No. 0 233 587. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyryllium complexes may also be used.

Examples of other photoinitiators potentially useful in the present invention may be selected from among diaryl ketone derivatives, quinones, benzoin alkyl ethers, alkoxy phenyl ketones, O-acylated oximinoketones, polycyclic quinones, phenanthrenequinone, naphthoquinone, diisopropylphenanthenequinone, benzophenones and substituted benzophenones, xanthones, thioxanthones, halogenated compounds such as chlorosulfonly and chloromethyl polynuclear aromatic compounds, chlorosulfonyl and chloromethyl heterocyclic compounds, chlorosulfonyl and chloromethyl benzophenones and fluourenones, haloalkanes and bishexaryl imidazoles. In many cases it is advantageous to use a combination with imaging photoinitiators.

Initiators including the ionic dye complexes may preferably include an autoxidizer. Suitable examples include N,N-dialkylanilines as described in the European Publication.

Various image-forming agents can be used in association with the radiation curable composition. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used and images can be formed by transfer to plain or treated paper. The internal phase itself has its own image-forming capability. For example, it is known that many of the toners used in xerographic recording processes selectively adhere to the image areas of an imaging sheet exposed and developed as in the present invention.

Furthermore, the image-forming agent can be provided inside the microcapsules, in the microcapsule wall, or outside the microcapsules in the same layer as the microcapsules or in a different layer. In the latter cases, the internal phase picks up the image-forming agent (e.g., by dissolution) upon being released from the microcapsules and carries it to the developer layer or an associated developer sheet.

Typical color precursors useful in the aforesaid embodiments include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethan compounds, xanthene compounds, fluorans, thiazine compounds, spiropyran compounds and the like. Crystal Violet Lactone and Copikem X, IV and XI (products of Hilton-Davis Chemical Co.) are often used alone or in combination as color precursors in the present invention, as are commercially available cyan, magenta and yellow color forming agents.

The discrete wall microcapsules used in the present invention can be produced using known encapsulation techniques including coacervation, interfacial polymerization, polymerization of one or more monomers in an oil, etc. Representative examples of suitable wall-formers are water soluble polymers (see U.S. Pat. Nos. 2,730,456 and 2,800,457 to Green et al.), gum arabic, polyvinyl alcohol, carboxy-methyl-cellulose; resorcinol-formaldehyde wall-formers (see U.S. Pat. No. 3,755,190 to Hart et al.); isocyanate wall-formers (see U.S. Pat. No. 3,914,511 to Vassiliades); isocyanate-polyol wall-formers (see U.S. Pat. No. 3,796,669 to Kiritani et al.); urea-formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al.); and melamine-formaldehyde resin and hydroxypropyl cellulose (see commonly assigned U.S. Pat. No. 4,025,455 to Shackle). A melamine-formaldehyde capsule is particularly preferred.

The mean microcapsule size used in the present invention generally ranges from about 1 to 25 microns.

The most common substrate for imaging sheets in accordance with this invention is a plastic film or paper. The paper may be a commercial impact raw stock, or special grade paper such as cast-coated paper or chrome-rolled paper. The latter two papers are preferred when using microcapsules having a diameter between approximately 1 and 5 microns because the surface of these papers is smoother and therefore the microcapsules are not as easily embedded in the stock fibers. Transparent substrates such as polyethylene terephthalate and translucent substrates can also be used in this invention. Another preferred substrate for the microcapsules is aluminized Mylar ™ (PET). The microcapsules can be located on either the top or bottom surface of a substrate to form an imaging sheet.

Figure 1B:
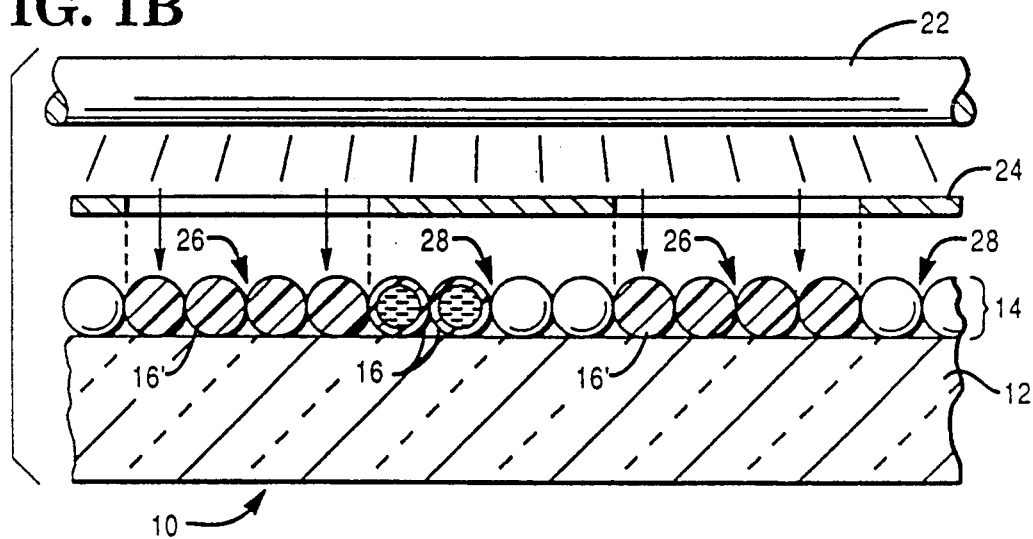
Figure 1C:
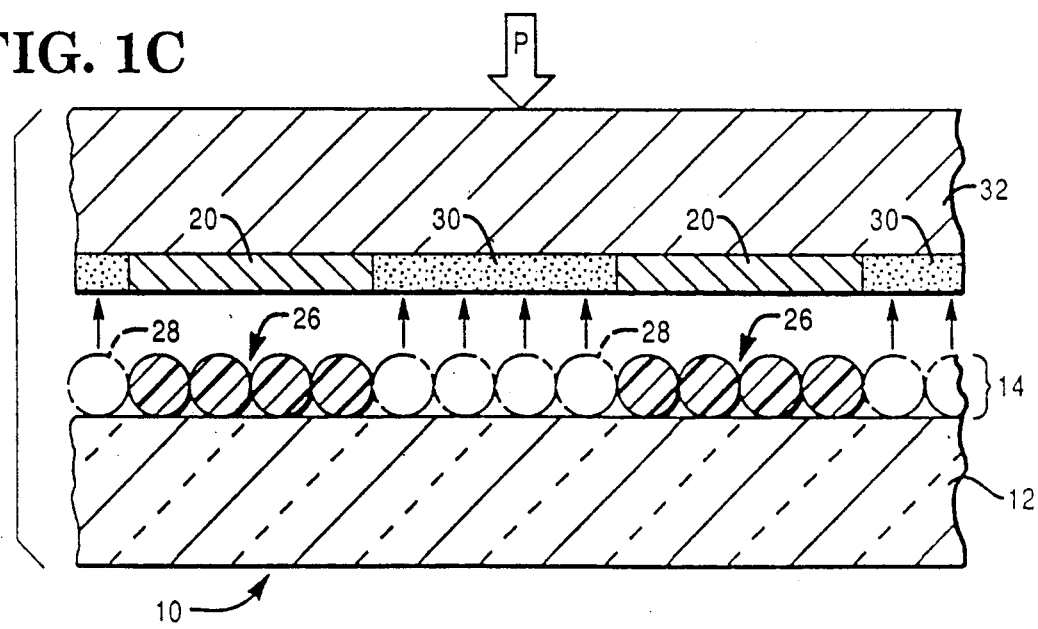

One example of the imaging media is shown in FIGS. 1A–1C. In FIG. 1A, an imaging sheet 10 is shown. The imaging sheet 10 is constituted by a substrate 12 coated with a layer of microcapsules 14. The microcapsules 14 are filled with an internal phase 16 containing the photosensitive composition. Usually, the microcapsules 14 also contain chromogenic material; however, as noted, the chromogenic material can be associated with the microcapsules 14 in other ways, such as by incorporation into the microcapsule wall or in a layer contiguous with the microcapsules 14.

The exemplary imaging sheet is one part of a two-part imaging media, wherein a separate receiver sheet (see FIG. 1C) carries a layer of a developer material 20. The developer material 20, described in greater detail below, reacts with the chromogenic material and produces a colored image when the microcapsules 14 are ruptured.

Exposure of the imaging sheet 10 is shown in FIG. 1B wherein a source of actinic radiant energy 22 is positioned above the surface of the imaging sheet 10 with a mask 24 positioned therebetween. In the illustrations of FIGS. 1A–1C, the substrate 12 is opaque and the photosensitive material within the microcapsules 14 is a positive working radiation curable material, i.e., the viscosity of the material increases upon exposure to actinic radiation.

In the preferred embodiment, commercially available lasers or high intensity broad band sources capable of providing intensities between 1000 ergs/cm$^2$ and 32,000 ergs/cm$^2$ are preferred. Preferably, the radiation is in the infrared, visible or ultraviolet wavelengths.

The radiation of the exposed areas 26 causes the radiation curable composition and the internal phase 16 of the microcapsules 14 to polymerize, thereby gelling, solidifying or otherwise immobilizing the chromogenic material and preventing the chromogenic material from reacting with the developer material 20. To simplify the illustration, internal phase 16' in the exposed areas 26 is shown as a solid; whereas the internal phase 16 remains liquid in the unexposed areas 28.

After the image-wise exposure step, as shown in FIG. 1C, a developer sheet 32 is positioned against the imaging sheet 10. Sheet 32 carries thereon a developer material 20. The two sheets are together subjected to pressure to apply to the microcapsules a uniform rupturing force in the presence of the developer material so as to form an image.

Referring to FIG. 1C, the solidified microcapsules within the exposed areas 26 retain their contents, whereby no visible marking of the sheet within these regions will occur. In unexposed areas 28, the microcapsule contents will interact with the developer 20, thereby producing visibly marked areas 30 which together comprise the final image on sheet 32.

Where the image-forming agent is not a dye or pigment, the developer material is selected to react with the image-forming agent to form an image. Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxynaphthoate, zinc 3, 5-di-tert-butyl salicylate, oil soluble metal salts or phenol-formaldehyde novolak resins (e.g., see U.S. Pat. Nos. 3,672,935; 3,732,120 and 3,737,410) such as zinc modified oil soluble phenolformaldehyde resin as disclosed in U.S. Pat. No. 3,732,120, zinc carbonate etc. and mixtures thereof. A preferred class of glossable developers is described in commonly assigned U.S. application Ser. No. 073,036, filed July 14, 1987.

The developer material may be located on a support (not shown) separate from the imaging sheet to thereby form a transfer image coating system. In such a system, the imaging sheet and the developer sheet are brought together in the presence of a uniform rupturing force to cause the image-forming agent to migrate to the developer sheet and form an image on the developer sheet. The support may be made of paper, or a transparent film such as polyethylene terephthalate.

Alternatively, the developer material may be located on the same surface as the layer of microcapsules to form a self-contained sheet. In this configuration, the substrate is coated with a first coating of the photosensitive microcapsules. Alternatively, the microcapsules and developer material can be mixed and coated as a single layer as is readily understood in the art.

The manner in which the imaging material may be adapted for full color imaging is disclosed in U.S. Pat. No. 4,576,891 and U.S. Pat. No. 4,842,976, which are both hereby incorporated by reference. The substrate is coated with a layer of microcapsules which individually contain cyan, magenta and yellow color formers and photosensitive compositions which have distinctly different wavelength sensitivities. A uniform mixture of these microcapsules is distributed over the surface of the substrate. An image is formed by exposing the imaging sheet using different exposure wavelengths of actinic radiation to which the different photosensitive compositions are sensitive. This may be done sequentially by separately exposing color separations on to the media, or by exposing all colors simultaneously using a light source containing at least the exposure wavelengths required by the photosensitive compositions. Upon passing the material through the developer, the released color formers react with the developer material to produce a full color image.

Figure 2:
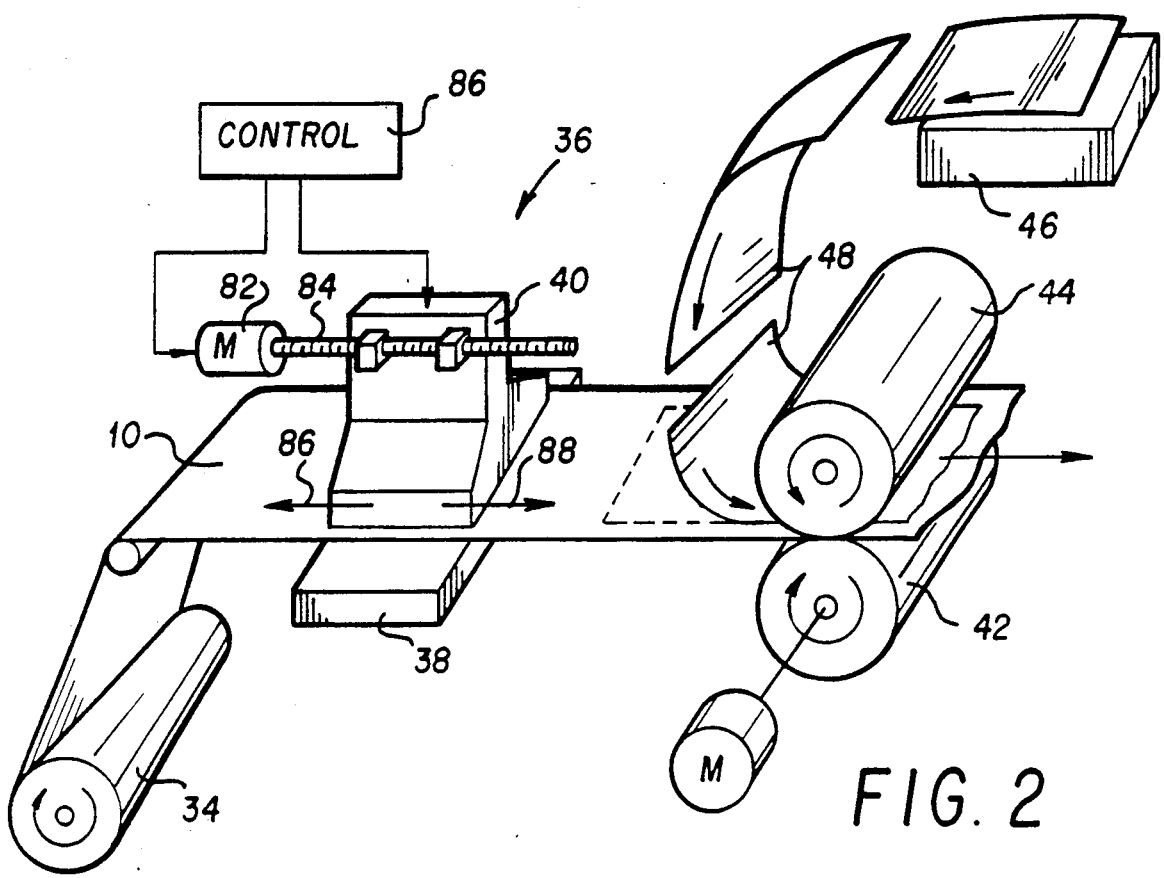
FIG. 2 is a schematic view of an imaging apparatus in accordance with the present invention.

A schematic diagram of an imaging apparatus in accordance with the invention can be seen by reference to FIG. 2. (It should be understood that the term "imaging sheet" includes the imaging media described herein, whether processed in the form of a continuous web, individual cut sheets, or some other form.) The apparatus shown in FIG. 2 uses media of the two-part form, wherein a separate sheet carries the developer layer, with the finished image being produced on the receiver sheet.

The particular apparatus shown in FIG. 2 is intended for use with a web of imaging sheet material 10, such web being initially held within a storage roll 34. The material 10 passes from storage roll 34 into an exposure station 36 where the material is held on a supportive platen 38. The exposure source 40 is mounted above the platen 38, and exposure radiation exposes web 10 in accordance with the image information. In accordance with the present invention, the source 40 is a fiber-optic cathode ray tube (FOCRT), described in detail below, whereby a full color image may be made using the imaging media. During exposure, the capsule-coated side of web 10 is placed in contact, or closely thereto, with the faceplate of the FOCRT.

Figure 3:
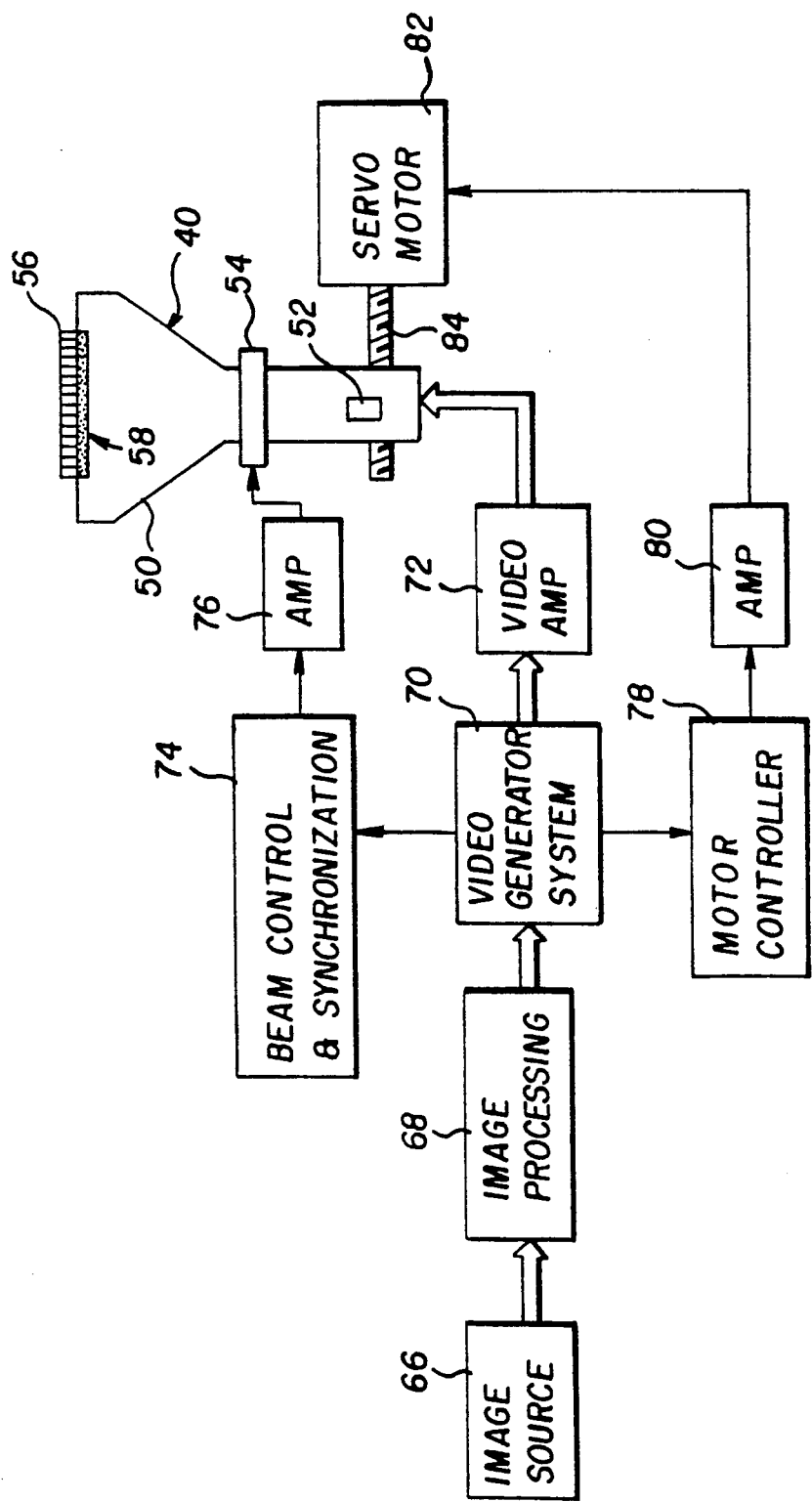
FIG. 3 is schematic diagram of a control system for the exposure apparatus.

The exposure system for the imaging media in accordance with the present invention can be seen in greater detail by reference to FIG. 3. The exposure source 40, as has been noted, is a fiber-optic cathode ray tube (FOCRT) which comprises a conventional tube housing 50, electron gun 52 and deflection coils 54. A faceplate 56 is positioned at the target end of the FOCRT, and comprises a closely packed array of short parallel optical fibers. Coated onto the inside surface of faceplate 56 are phosphor coatings 58.

Figure 4:
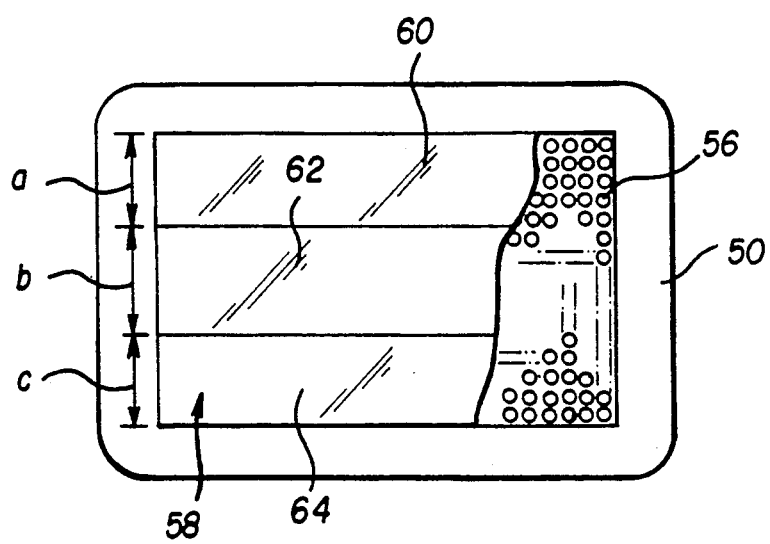
FIG. 4 is an elevational view of the display area of the cathode ray tube.

The arrangement of the phosphor coatings 58 can be better seen by reference to FIG. 4. The fiber-optic faceplate 56 is shown mounted to tube housing 50, with a portion of faceplate 56 broken away to reveal the phosphor coatings 58 applied to the rear surface of faceplate 56. Coatings 58 comprise three separate coatings 60, 62 and 64. Each is stimulated by the electron beam of the FOCRT, and phosphoresces in response thereto. However, each coating 60, 62 and 64 produces a separate color, i.e., red, blue or green, thereby accounting for the three color components of a color image.

Referring back to FIG. 3, the control system for the FOCRT includes an image source 66 which may be a means for computer generating images, an image scanner such as a CCD device, or any other appropriate source of input image data. Data from image source 66 is directed to an image processor 68, which may perform various processing techniques on the image to enhance its appearance and place the data into an appropriate form for output to the video generator system 70. Video generator system 70 provides three control outputs. The first is passed to a video amp 72 and then to electron gun 52, and controls the modulation of the electron beam produced by the FOCRT. A second control output is formatted at 74 to provide proper signals for beam control and synchronization. These signals, after being directed through amp 76, are used to control the deflection coils 54 so as to properly steer the electron beam to cause it to san the surface of the phosphor coatings 58.

In accordance with the preferred embodiment of this invention, relative movement at a fixed rate between the FOCRT 40 and the imaging media is caused while the image is being exposed. At the same time, the image is caused to scroll at the same rate over each of the three phosphor coatings 60, 62 and 64 so that there is no relative movement between a line of the image appearing on the FOCRT and a corresponding line exposed on the media.

Thus, video generator system 70 provides a third control output directed to a motor controller 78. After amplification at amp 80, the motor controller signal is applied to a servo motor 82 which, through a lead screw 84 or other appropriate means, causes movement of the FOCRT 40. Referring back to FIG. 2, motor 82 and lead screw 84, under control of the control means 86 as described in connection with FIG. 3, causes movement of FOCRT 40 as indicated by arrows 88. The media web 10 is therefore held stationary during the exposure operation.

By scrolling the three color components of the image over each of the three color phosphor coatings 60, 62 and 64, a complete, full-color image is exposed onto the imaging web 10.

An alternate embodiment for the control means 86 may be seen by reference to U.S. Pat. No. 4,309,720, which is hereby incorporated by reference.

Certain alternatives to the operation of the exposure system will be readily recognized. For example, FOCRT 40 may be held stationary, with the web 10 advanced synchronously with the scrolling of the image components over the phosphor coatings. Alternatively, each coating 60, 62 and 64 may be made large enough to display the complete image, whereby exposure may take place without scrolling of the images across the coatings. The coatings 60, 62 and 64 may be overlapped to form a single, multi-color coating, whereby a full-color image may be exposed at one time.

As has been noted, the imaging media used herein exhibits an effect known as short time-scale reciprocity failure. While one would expect that the imaging media would exhibit a substantially linear relationship between exposure time and exposure intensity, at short exposure times, the media in fact shows a dramatic loss in sensitivity. One approach to minimizing this effect is to lengthen the time of exposure.

The different color microcapsules exhibit reciprocity failure to differing degrees, and at different threshold exposure intensities. The present invention compensates for this effect by varying the widths of the coating stripes formed on the inside surface of the FOCRT faceplate 56.

Referring back to FIG. 4, it can be seen that each of the coatings 60, 62 and 64 are of a width a, b and c, respectively. While in one embodiment, these widths may be equal, it is not necessary that they be so, due to the scrolling manner in which the image information is displayed for exposing the media. For example, if coating 60 was used to provide the red color component, and if width a were made larger than widths b and c, the total exposure energy applied to the imaging web for the red color component could be increased, provided that the intensity of the electron beam (and hence the intensity of the phosphorescence of the coating) remain the same. Alternatively, the intensity of the exposure could be reduced, while the exposure time would be increased as a result of the widened coating, thereby resulting in an exposure energy which is equal to that for the other color components, but at a reduced intensity. Either approach may be useful in overcoming the effects of short time-scale reciprocity failure.

In one example, the width of the coating for the red color component may be formed to be approximately 400% of the width of the coatings used for the blue and green components.

Figure 5:
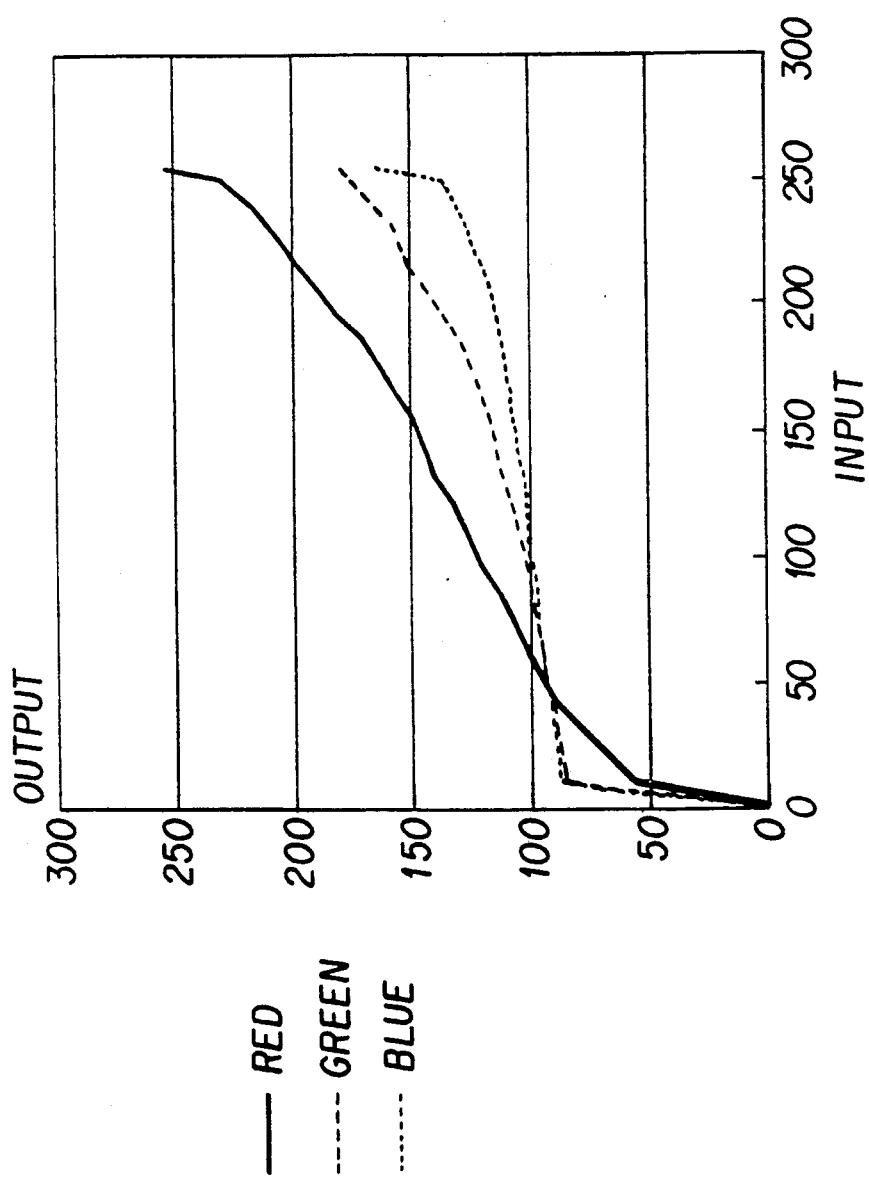
FIG. 5 is a plot of system response for an apparatus in accordance with the present invention showing remapping of input and output data.

In a working example, a test image was formed using an apparatus such as that described herein, wherein 24 bits per dot of light modulation onto a continuous tone microencapsulated media was used. FIG. 5 illustrates the system response by showing the manner in which input image data was remapped for a linear reflective scale on the output image.

The exemplary system using a single beam CRT required a three minute total exposure time for an A4 size image. Two-thirds of the exposure time was spent in exposing the red component:

|       | Exposure Energy ergs/cm$^2$ | Exposure Time |
|-------|----------------------------|---------------|
| Red   | 5890                       | <2 min.       |
| Green | 2510                       | <30 sec.      |
| Blue  | 1820                       | <30 sec.      |

Figure 6:
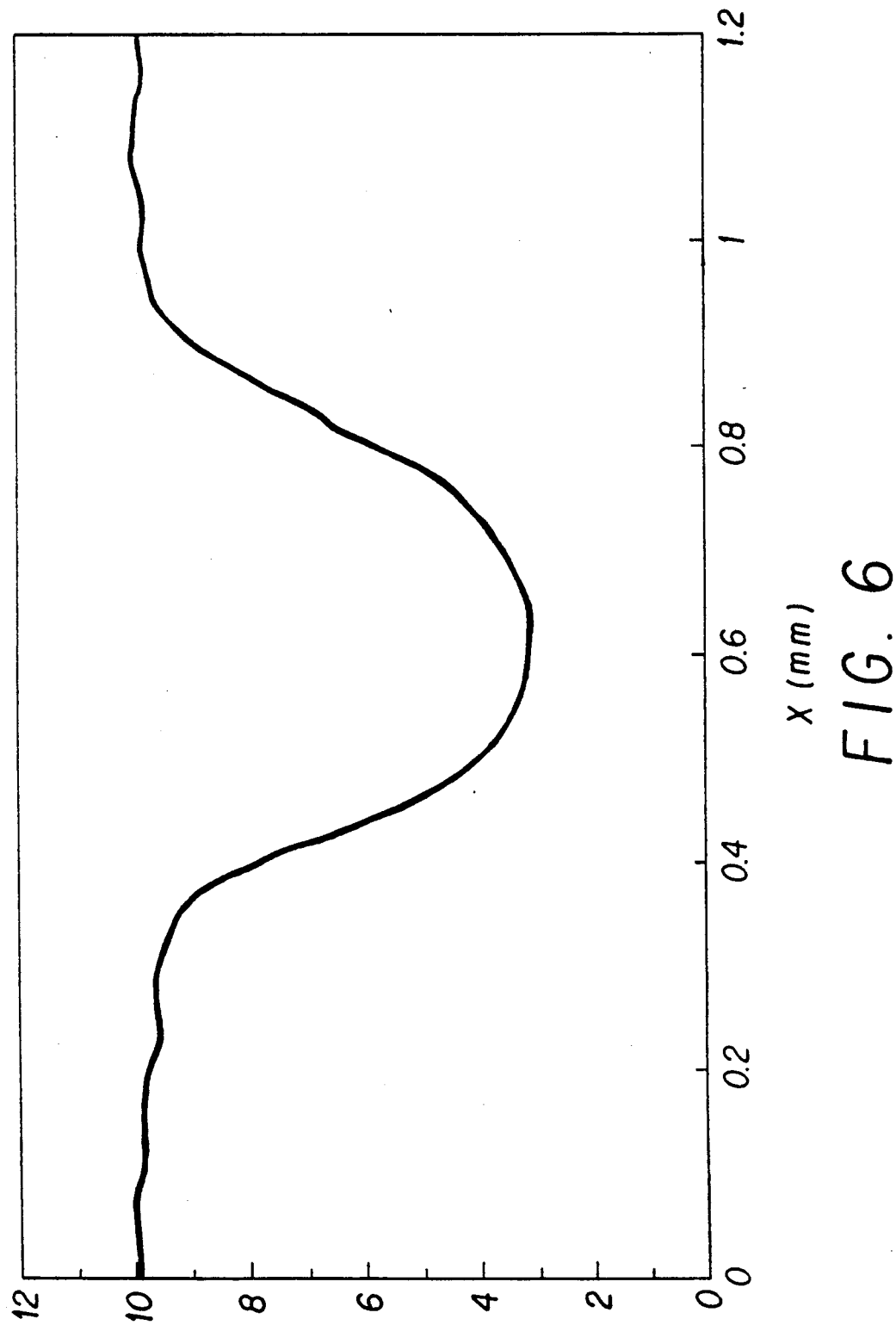
FIG. 6 is an image density trace showing a line profile produced with the apparatus.
Figure 7:
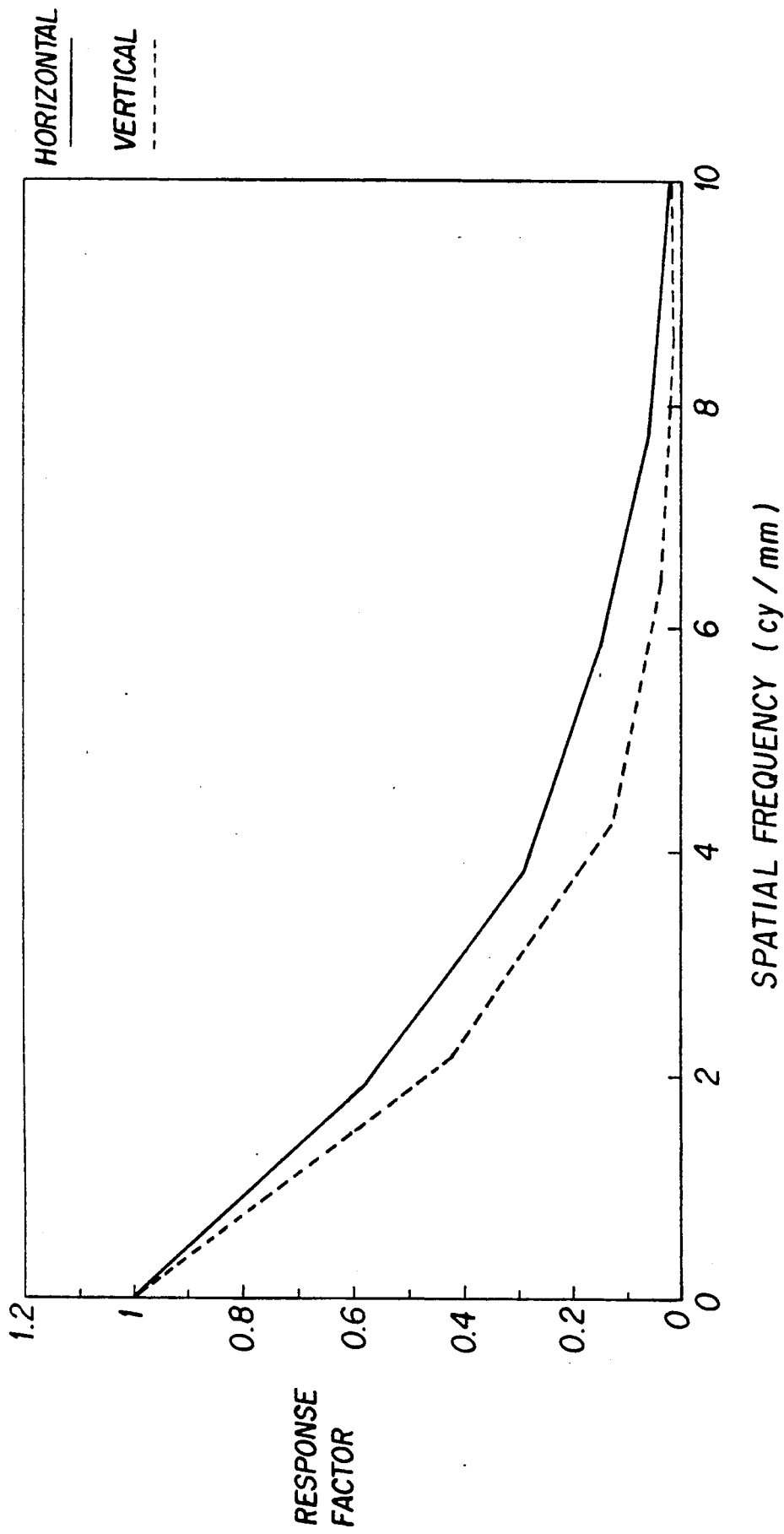
FIG. 7 is a plot showing Fourier transform of the line edge derivative for lines produced with the apparatus.

Image and text quality achieved with the system may be seen from the line profile of a white horizontal line written on a black background shown in FIG. 6. The Fourier transform of the line edge derivative for horizontal and vertical black edges is shown in FIG. 7.

Figure 8:
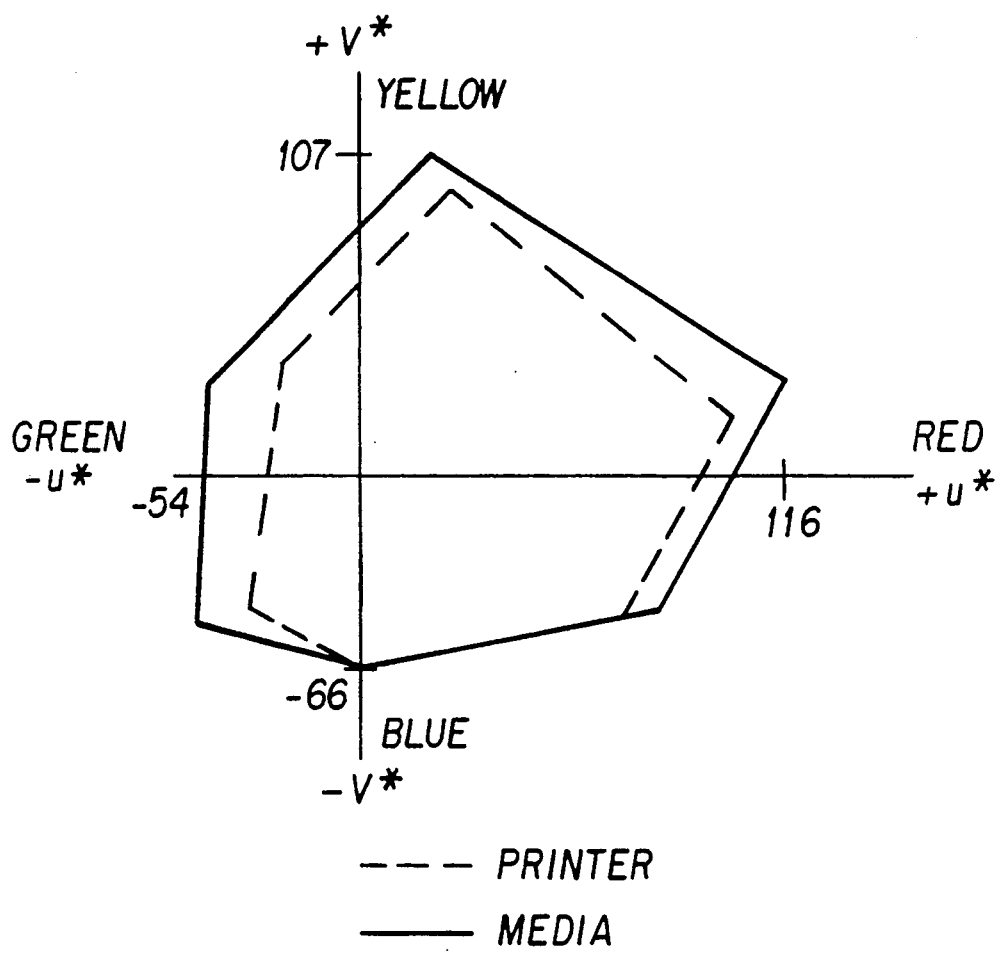
FIG. 8 is a plot showing a color gamut produced with the apparatus.

Finally, the broad color gamut available with the microencapsulated color media can be nearly realized using the FOCRT system described herein. FIG. 8 illustrates the color gamut of both the media and the exemplary color printer.

While the methods herein described, and the forms of apparatus for carrying these methods into effect, constitute preferred embodiments of this invention, it is to be understood that the invention is not limited to these precise methods and forms of apparatus, and that changes may be made in either without departing from the scope of the invention, which is defined in the appended claims.

What is claimed is:

1. A system for recording a color image, comprising:
   a sheet of photosensitive media having a supportive substrate with a layer of intermixed first and second microcapsules coated thereon, said first microcapsules containing a first color image forming agent and a first photohardenable composition responsive to light of a first wavelength, and said second microcapsules containing a second color image forming agent and a second photohardenable composition responsive to light of a second wavelength;
   a cathode ray tube having a faceplate and first and second color phosphor coatings applied on an inside surface of said faceplate, said first and second coatings being applied to define first and second stripes respectively extending across said faceplate and having first and second widths respectively;
   said faceplate comprising an array of parallel optical fibers;
   means for generating first and second image signals corresponding to first and second color components respectively of an image to be recorded;
   control means for receiving said first and second image signals and controlling said cathode ray tube to write said first color component onto said first phosphor coating and to write said second color component onto said second phosphor coating so as to scroll said first and second color components at a first scroll rate over said phosphor coatings;
   means for supporting said sheet and for moving said sheet past said faceplate with said microcapsules adjacent thereto, at a rate equal to image comprised of said first and second color components is exposed onto said sheet; and
   wherein said first width for said first stripe is greater than said second width for said second stripe, said widths being less than the length of said image.

2. The system of claim 1 wherein said control means controls said cathode ray tube to write said first color component onto said first phosphor coating at an intensity less than that at which said second color component is written onto said second phosphor coating.

3. A system for recording a color image, comprising:
   a sheet of photosensitive media having a supportive substrate with a layer of intermixed first and second microcapsules coated thereon, said first microcapsules containing a first color image forming agent and a first photohardenable composition responsive to light of a first wavelength, and said second microcapsules containing a second color image forming agent and a second photohardenable composition responsive to light of a second wavelength;
   a cathode ray tube having a faceplate and first and second color phosphor coatings applied on an inside surface of said faceplate, said first and second coatings being applied to define first and second stripes respectively extending across said faceplate and having first and second widths respectively;
   said faceplate comprising an array of parallel optical fibers;
   means for generating first and second image signals corresponding to first and second color components respectively of an image to be recorded;
   control means for receiving said first and second image signals and controlling said cathode ray tube to write said first color component onto said first phosphor coating and to write said second color component onto said second phosphor coating so as to scroll said first and second color components at a first scroll rate over said phosphor coatings;
   means for supporting said sheet and for moving said sheet past said faceplate with said microcapsules adjacent thereto, at a rate equal to image comprised of said first and second color components is exposed onto said sheet; and
   wherein said first phosphor coating and said second phosphor coating are at least partially coincident.

* * * * *